US012662731B2

(12) United States Patent
Giraldo et al.

(10) Patent No.: US 12,662,731 B2
(45) Date of Patent: Jun. 23, 2026

(54) SPUTTERING MACHINES, SUBSTRATE HOLDERS, AND SPUTTERING PROCESSES WITH MAGNETIC BIASING

(71) Applicant: VIRGINIA COMMONWEALTH UNIVERSITY, Richmond, VA (US)

(72) Inventors: Santiago Vargas Giraldo, Richmond, VA (US); Carlos Eduardo Castano Londono, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 0 days.

(21) Appl. No.: 18/293,582

(22) PCT Filed: Aug. 10, 2022

(86) PCT No.: PCT/US2022/039899
§ 371 (c)(1),
(2) Date: Jan. 30, 2024

(87) PCT Pub. No.: WO2023/018758
PCT Pub. Date: Feb. 16, 2023

(65) Prior Publication Data
US 2024/0337009 A1       Oct. 10, 2024

Related U.S. Application Data

(60) Provisional application No. 63/231,340, filed on Aug. 10, 2021.

(51) Int. Cl.
*C23C 14/35* (2006.01)
*C23C 14/50* (2006.01)
(Continued)

(52) U.S. Cl.
CPC ............ *C23C 14/351* (2013.01); *C23C 14/50* (2013.01); *C23C 14/54* (2013.01);
(Continued)

(58) Field of Classification Search
CPC ....... C23C 14/351; C23C 14/50; C23C 14/54; H01J 37/3266; H01J 37/32715; H01J 37/3405
(Continued)

(56) References Cited

U.S. PATENT DOCUMENTS 5,223,113 A * 6/1993 Kaneko ............. H01L 21/67103
156/345.46
5,455,197 A * 10/1995 Ghanbari .............. C23C 14/351
204/298.03
(Continued)

FOREIGN PATENT DOCUMENTS

| EP | 0098672 A2 | 11/1983 |
| JP | 2007-204786 * | 8/2007 |
| WO | 2009/075393 A1 | 6/2009 |

OTHER PUBLICATIONS

Machine Translation JP 2007-204786 (Year: 2007).*
Machine Translation EP 0093672 (Year: 1983).*

*Primary Examiner* — Rodney G McDonald
(74) *Attorney, Agent, or Firm* — WCF IP

(57) ABSTRACT

Sputtering machines and substrate holders for such systems are described which include one or more magnets apart from the magnets typical of sputtering guns. The added magnets produce a magnetic field bias which is a new means for controlling depositional flux, ionization degree of a sputtered species, and microstructure properties of deposited coatings. An exemplary substrate holder may have a magnet or magnet array near or next to the surface supporting the substrate, and the magnet may assume multiple different magnetic field configurations depending on the desired properties of the resulting magnetic field bias within the reaction chamber.

19 Claims, 11 Drawing Sheets

(51) Int. Cl.
   *C23C 14/54*     (2006.01)
   *H01J 37/32*     (2006.01)
   *H01J 37/34*     (2006.01)

(52) U.S. Cl.
   CPC .... *H01J 37/3266* (2013.01); *H01J 37/32715*
                 (2013.01); *H01J 37/3405* (2013.01)

(58) Field of Classification Search
   USPC ............ 204/298.16, 298.09, 298.15, 192.12
   See application file for complete search history.

(56)                References Cited

U.S. PATENT DOCUMENTS

| | | | |
|---|---|---|---|
| 6,207,536 | B1 | 3/2001 | Matsumoto et al. |
| 8,968,538 | B2 * | 3/2015 | Kitada ................ H01J 37/3414 |
| | | | 204/298.18 |
| 2003/0180450 | A1 * | 9/2003 | Kidd ................. H01J 37/32422 |
| | | | 427/535 |
| 2011/0165775 | A1 | 7/2011 | Hirayama et al. |
| 2011/0303527 | A1 | 12/2011 | Hosoya et al. |
| 2016/0028093 | A1 | 1/2016 | Pietrasz et al. |
| 2016/0170314 | A1 | 6/2016 | Lafarre et al. |
| 2017/0029940 | A1 | 2/2017 | Van De Putte et al. |
| 2017/0065734 | A1 | 3/2017 | Izrailit |

* cited by examiner

500

501

502

SPUTTERING MACHINES, SUBSTRATE HOLDERS, AND SPUTTERING PROCESSES WITH MAGNETIC BIASING

CROSS-REFERENCE TO RELATED APPLICATIONS

This application claims the benefit of U.S. provisional patent application No. 63/231,340, filed Aug. 10, 2021, the complete contents of which are herein incorporated by reference.

FIELD OF THE INVENTION

Embodiments generally relate to physical vapor deposition (PVD) and, in particular, sputtering equipment and processes that accept a variety of substrates and improve control and performance of sputtering processes.

BACKGROUND

Sputtering equipment is traditionally used for solid flat substrates such as silicon wafers. Many conventional sputtering reactors do not accommodate substrates other than solid flat substrates.

Control of the species excitation is a significant factor in plasma processes. Conventional means for controlling species excitation include the level of power supplied to a magnetron sputtering gun, the composition and density of gas present during sputtering (e.g., argon and/or nitrogen gas), the composition of the target, and design features of the sputtering gun itself.

A need exists for sputtering equipment that accepts more types of substrates. A further need exists for additional and improved control over species excitation and other sputtering process parameters.

SUMMARY

An aspect of some exemplary embodiments is sputtering equipment offering improved means of controlling deposition flux and ionization degree of sputtered species. For instance, features unique to present embodiments may be used to improve the ionization rates in direct current magnetron sputtering (DCMS) and high-power impulse magnetron sputtering (HiPIMS) processes. Several chemical vapor depositions may be used for the direct deposition of structures. Exemplary embodiments improve the spectra of materials and structures which may be deposited using physical vapor deposition (PVD).

Another aspect of some exemplary embodiments is the capability of handling both flat substrates as well as powder-based materials with significant control over the chemistry and microstructure of the deposited coatings on either type of substrate.

Exemplary devices and methods allow coating of powders to produce core-shell structures. Such structures have a variety of applications, including but not limited to catalysis, powder metallurgy, sintering-based processing, additive manufacturing, pigments, powder feedstocks and processes which use them, and other sectors and industries. As one nonlimiting example, exemplary devices and processes of this disclosure may be used for controlling the incorporation of nitrogen in chromium films. Other film stoichiometries may be achieved or improved as a result of exemplary devices and processes. Another exemplary application is performing direct writing of 2D and 3D structures. Exemplary embodiments may further allow for direct writing deposition of structures with tailored stoichiometries or structures. Exemplary embodiment may further be used for the fabrication of nano and microdevices.

DETAILED DESCRIPTION

Figure 1:
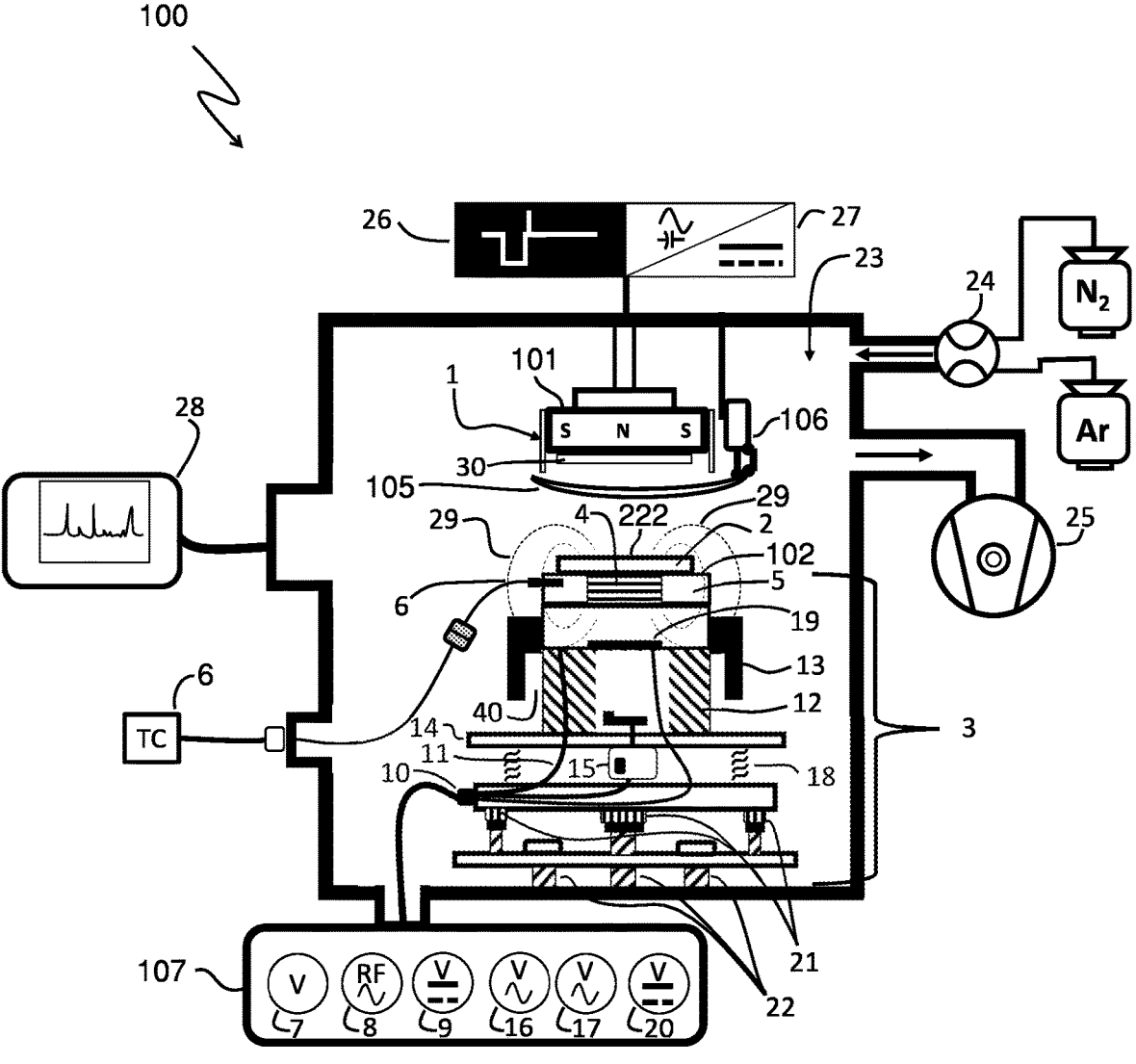
FIG. 1 is an exemplary sputtering machine.

FIG. 1 depicts an exemplary sputtering machine 100. The sputtering machine 100 may be interchangeably referred to as a machine, reactor, apparatus, device, or system in this disclosure. For instance, machine 100 may be referred to as a sputtering coatings deposition system, a magnetron sputtering system, or the like. The substrate 2 to be coated by the machine's sputtering process may be but is not limited to a flat substrate (e.g., when the machine 100 is being used for thin film deposition) or a powder substrate (e.g., when the machine 100 is being used to produce core-shell particles). At a high level, the machine 100 comprises a process chamber 23, one or more sputtering guns 1, one or more substrate holders 3, and various support systems discussed in greater detail below. The sputtering gun 1 and substrate holder 3 are both arranged partly or entirely inside chamber 23.

One or more sputtering guns 1 may be included inside the chamber 23. For clarity of illustration, a single gun 1 is depicted in FIG. 1. A sputtering gun 1 may be of a known commercially available type, e.g., a commercially available magnetron sputtering gun. Generally speaking, a sputtering gun 1 comprises one or more magnets, collectively identified in FIG. 1 as magnet 101. It should be understood that this disclosure frequently makes use of the singular noun "magnet" for ease of discussion, but the option to have and use an array of multiple individual magnets is implied. The magnet 101 may be an array of multiple magnets. Irrespective of the number of individual magnets, FIG. 1 depicts an arrangement in which a north pole is situated at a center of the gun 1. The center is surrounded by a ring of south poles. Alternatively, the magnet 101 may have a south pole at a center surrounded by an annular array of north poles. The center may itself be a ring of individual magnets, such that the magnet 101 comprises or consists of an inner ring (of magnets) and an outer ring (of magnets) surrounding the inner ring. The inner ring magnets all share the same orientation with one another such that all have the north pole oriented toward the substrate holder 3, or else all of the magnets of the inner ring have the south pole oriented toward the substrate holder 3. The magnets forming the outer ring all share the same orientation with one another such that all have the south pole oriented toward the substrate holder 3, or else all of the magnets of the outer ring have the north pole oriented toward the substrate holder 3. Suitable materials for the magnet array include but are not limited to neodymium (NdFeB) magnets and Samarium-cobalt (SmCo) magnets. The sputtering of gun 101 may be controlled with a shutter 105 which is moved to cover or uncover the target 30 by a shutter actuator 106.

Target 30 is the source of deposition atoms, the physical starting material intended to become a coating on substrate 2. A target 30 is typically shaped as a disk that is mountable adjacent to the magnet 101 of a gun 1. Multiple guns 1 in a single chamber 23 allow for multiple targets 30 of different materials from one another to be introduced concurrently to a chamber, such that multiple different coatings may be applied to a substrate in succession without opening the chamber 23 to an external environment. Target 30 and resultant coatings may be of any material known to the field of sputtering at the time of this disclosure as well as materials introduced at a future date. Exemplary nonlimiting examples of target 30 and coating materials include metallic materials of a single elemental metal as well as compounds, e.g., comprising multiple metallic elements. The target 30 and coatings resulting from sputtering of target 30 may be any of a variety of elements or materials, for instance a metallic bulk material such as but not limited to any transition metal, aluminum, carbon, silicon or germanium, or compounds such as but not limited to nitrides, carbides or oxides.

A substrate holder 3 may be referred to by other names, such as but not limited to "sample holder". An exemplary substrate holder 3 has certain features and functionalities which are not present in any sputtering machines which precede this disclosure. Generally, unique features of exemplary substrate holders according to the present disclosure include new capabilities to influence the plasma composition and deposition properties of a sputtering process as well as considerable versatility with respect to the type of substrate with which the substrate holder may be loaded.

A planar substrate 2 or similar may be mounted to (e.g., placed on, clipped to, etc.) a surface 102 of the substrate holder 3 which faces the one or more sputtering guns 1. The surface 102 is arranged to hold or support the substrate 2 while the substrate 2 is coated by target material (i.e., material from target 30) sputtered by gun 1. Note that FIG. 1 shows one exemplary arrangement in which the sputtering gun 1 is at a top of the chamber 23 aimed downward (according to Earth's gravity) whereas the substrate holder 3 is arranged at a bottom of the chamber 23 below the gun 1, with the surface 222 of substrate 2 which is to be coated aimed upward (according to Earth's gravity). However, some embodiments may take alternative arrangements. For instance, one or more sputter guns 1 may be at the bottom of the chamber 23 facing upward, and the substrate holder 3 may be at the top of the chamber 23 facing downward such that the surface 222 of substrate 2 also faces downward.

As a significant departure from conventional substrate holders, substrate holder 3 comprises at least one permanent magnet 4 for altering and strengthening the magnetic fields 29 at or beside the surface 102. As a non-limiting example, the magnetic flux density at or beside the surface 102 may be within the range of 0.05 mTesla (mT) to 2.0 Tesla (T), depending on the embodiment. As further examples, the magnetic flux density at or beside the surface 102 may be 0.05 mT or higher, 0.10 mT or higher, 0.15 mT or higher, 0.20 mT or higher, 0.50 mT or higher, 0.001 T or higher, 0.01 T or higher, 0.10 T or higher, 0.50 T or higher, 1.0 T or higher, or have a different threshold or range than these non-limiting examples. The at least one magnet 4 is separate from and not a part of the one or more sputtering guns 1. The magnet 4 is a distinct and separate magnet from magnet 101 of a sputtering gun 1. The magnet 4 and magnet 101 are physically apart. The magnet 101 is physically incorporated into a gun 1, whereas the magnet 4 is part of the substrate holder 2. As shown in FIG. 1, an exemplary position for magnet 4 is behind substrate 2. As a result of this arrangement, the surface 102 and substrate 2 lie in a path between the magnet 4 and the sputter gun 1. Depending on the embodiment, the magnet 4 may be level with surface 102 or behind surface 102. In this context, "behind" means the surface 102 and/or substrate 2 is closer to the gun 1 than is the magnet 4. Even more specifically, the surface 102 and/or substrate 2 lies in the shortest linear path between the magnet 4 and gun 1.

The magnetic field 29 caused by magnet 4 may be referred to interchangeably as a "bias field", "bias magnetic field", "bias", "biasing", "magnetic field bias", or "magnetic field biasing" in some embodiments. In some instances, the term "electric biasing" or "electric bias" may also be used interchangeably, particularly where the magnet 4 is or includes an electromagnet the magnetic field from which is manipulated and controlled by electric signals. The magnetic field 29 created by magnet 4 is a field separate and apart from the magnetic field produced by a sputter gun 1, although the relative proximity of magnet 4 and the magnet 101 of a sputter gun 1 and the strength of the respective magnets may result in both fields affecting the same spaces and any species in those spaces at the same time (see, for instance, FIG. 2C and its description below). Alternatively, in some embodiments, the distance between the magnet 4 and magnet 101 of the sputter gun 1 and/or the strengths of the respective magnets may be selected such that that species in the sputtering machine 100 are, at a given moment in time, only significantly affected by one or the other of the two magnetic fields, but not by both at the same time.

The magnet 4 may be either a permanent magnet or an electromagnet, for example, or a combination of permanent magnets and electromagnets. For convenience of discussion, element 4 is generally referred to in the singular, "magnet". However, it should be understood that "magnet" 4 may be either a single magnet or an array of multiple magnets.

The magnetic biasing caused/produced by magnet 4 may be managed by a controller. The controller is configured for changing one or more properties of the one or magnetic fields of the at least one magnet and/or monitoring the bias produced by the magnet 4. Said differently, a controller may be provided for regulating the one or more magnetic fields generated by the at least one magnet 4. In FIG. 1, the controller comprises or consists of a power supply 7 and/or bias/etching power supplies 8 or 9, which are electrically connected to the holder cup 5 (or more specifically magnet 4, whether or not a given embodiment has a holder cup 5) through the electrical connections 10 and 11. Collectively the one or more power supplies or power regulators and the connections to magnet 4 may be regarded as control electronics or control circuitry. The same controller or additional controllers, each of which may comprise one or more processors, may be used to control any other devices, systems, or components of embodiments described in this disclosure.

An exemplary substrate holder 3 may comprise an isolator 12 which electrically isolates the surface 102. To serve this purpose, an exemplary isolator comprises a minimum ground to substrate impedance of 3 Mohm. An exemplary isolator may be one or more nonconductive (insulative) solids. The surface 102 and whatever structure to which it belongs (e.g., a holder cup 5) may be mounted to the isolator 12, thereby helping maintain a desired position of the surface 102. In FIG. 1, the isolator 12 physically supports the weight (caused by Earth's gravity) of the holder cup 5 and magnet 4. The isolator 12 may be a cylinder that electrically isolates the substrate holder cup 5. Other shapes besides cylindrical may be used in alternative configurations. An exemplary isolator 12 comprises or consists of polytetrafluoroethylene (PTFE) or alumina, and an exemplary electrical isolation provided by isolator 12 is above 3 kV and 10 MΩ.

An exemplary substrate holder 3 may further comprise a deflector 13 that shields the isolator from at least some metallization that would occur to the isolator were the deflector 13 not present. To achieve this functionality, the deflector 13 may comprise or consist of a conductive and nonmagnetic solid, especially on its exposed surfaces. For instance, the deflector 13 or at least its exposed surfaces may be made of aluminum or stainless steel. The material of the deflector 13, in particular the material of its exposed surfaces, are selected so as to favorably avoid the metalizing effect during the deposition process and the impairing of electrical isolation by at least 20000 hours. The deflector 13 at least partly encases the isolator 12 while leaving a gap 40 that separates an inner surface of the deflector 13 and an outer surface of the isolator 12. The gap 40 is a space empty but for possible gaseous atoms or molecules. In other words, no solid (or liquid for that matter) exists in gap 40. A gas or plasma may enter gap 40 but a near or total vacuum in gap 40 is desirable. Deflector 13 relies on the gap 40 to avoid the complete metallization of the isolator 12. An exemplary gap 40 is between 0.5 mm and 20 mm, for example. The height of the deflector 13 may be adjusted accordingly to the gap size choice.

Figure 2A:
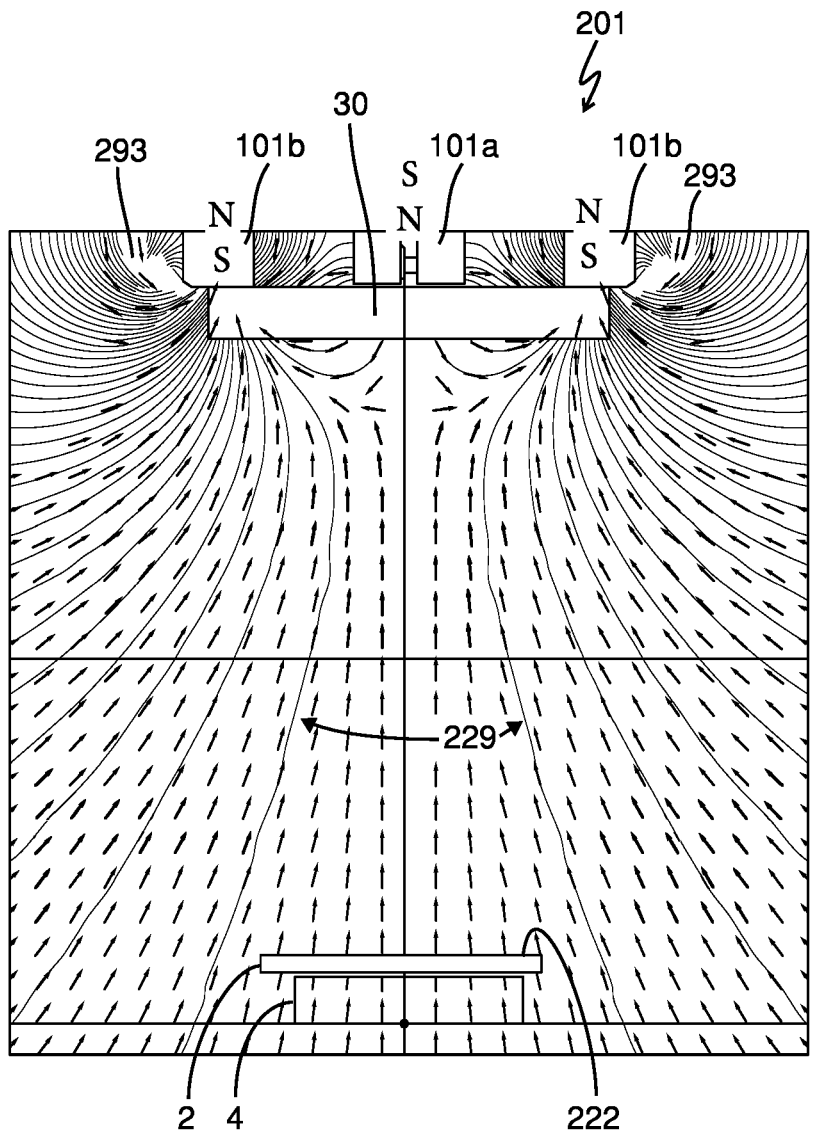
FIGS. 2A, 2B, and 2C show alternative shapes of magnetic fields/field lines generated by exemplary systems.
Figure 2B:
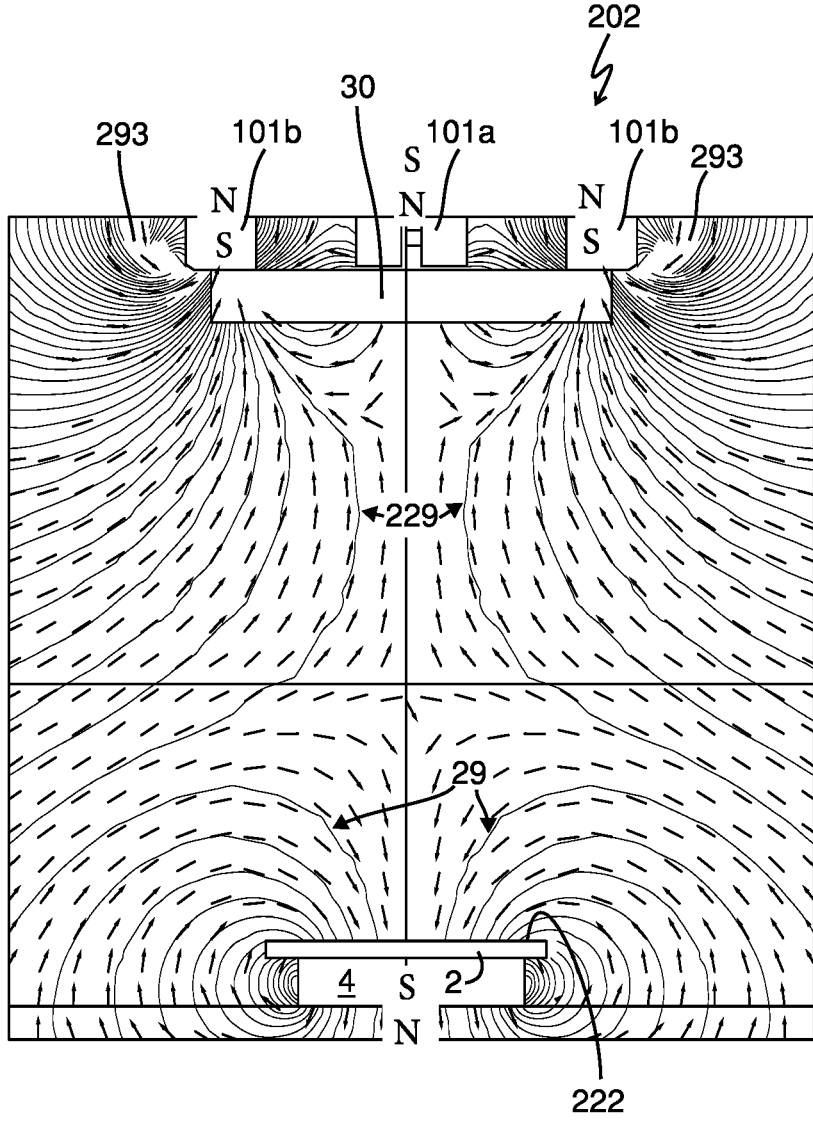
Figure 2C:
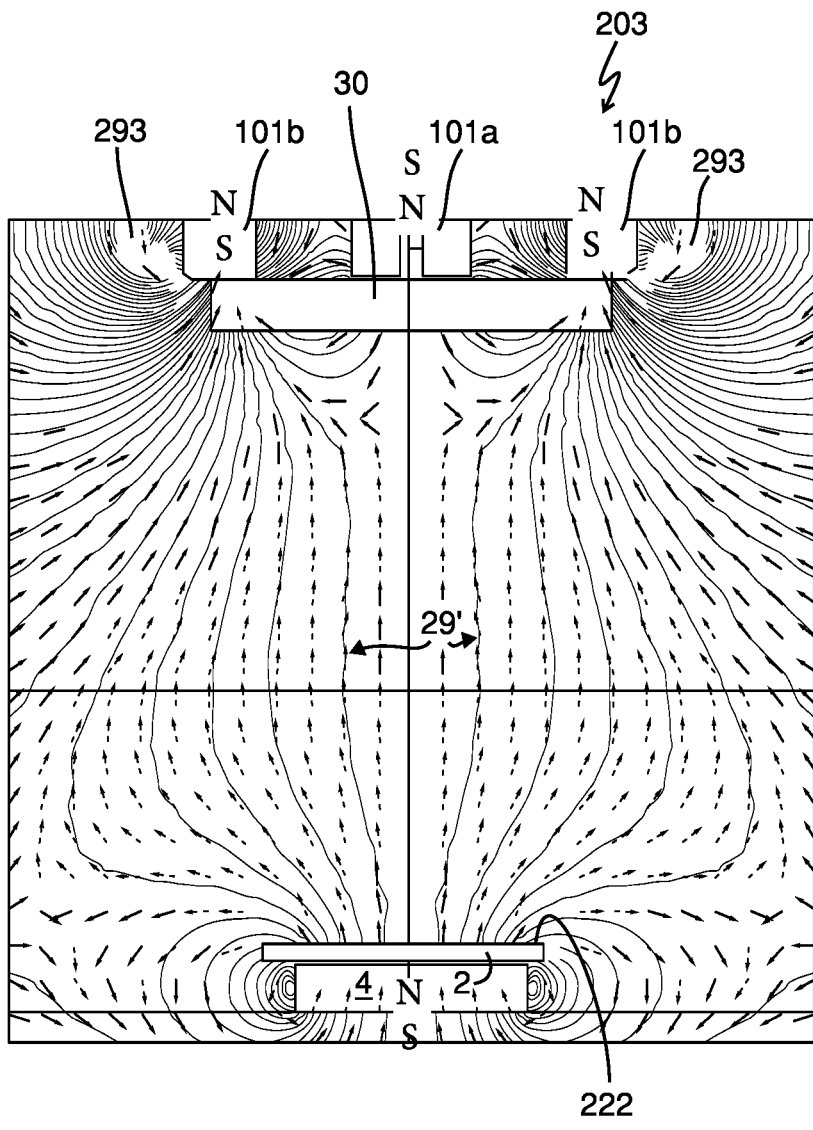

FIGS. 2A, 2B, and 2C show three nonlimiting examples of magnetic fields within a process chamber 23 which may be achieved in a sputtering machine 100 that comprises the magnet 101 of a sputter gun 1 and a magnet 4 of the substrate holder 3. Each different magnetic field shape is the result of a different magnetic configuration. For the following discussion of FIGS. 2A, 2B, and 2C, reference is made to subcomponents of magnet 101. The magnet 101 in these exemplary configurations is an array, as mentioned above, which comprises an inner ring 101a and an outer ring 101b. Note that in all three of FIGS. 2A, 2B, and 2C, the magnetic field strength in regions 293 to the outer sides of ring 101b is too high for accurate depiction using separate field lines at the depicted resolution and, in place of visually merged lines, no field lines are depicted in regions 293 despite the actual high density.

FIG. 2A shows a first configuration 201 which does not use any permanent magnets at the substrate 2. The magnet 4 may be an electromagnet to which no current is supplied during periods of time when configuration 201 is required, with the effect that magnet 4 produces no magnetic field until such time a current is again supplied by the controller of the magnet 4. Alternatively, the magnet 4 may be removable and taken out of the substrate holder 3 to achieve the configuration 201. The configuration 201 may match a conventional configuration used in magnetron sputtering, whereby the magnetic forces 229 within the process chamber are only from the sputter gun 1. In the configuration 201, the field lines generated in the inner ring 101a close in the outer ring 101b. However not all the field lines generated on the outer ring 101b pass through the inner ring 101a.

FIG. 2B shows a second exemplary magnetic field configuration 202, and FIG. 2C shows a third exemplary magnetic field configuration 203. The configuration 202 of FIG. 2B and the configuration 203 of FIG. 2C both use an active magnet 4 behind the surface of substrate 2. The active magnet may be either an electrified electromagnet or a permanent magnet, for example, or an array that includes one or both types of magnets.

According to FIG. 2B's configuration 202, the center axis of the magnet poles of magnet 4 is aligned with the center axis of inner ring 101a of the gun 1. A center axis of magnet 4 is coaxial with the center axis of inner ring 101a. The field lines 29 generated on the magnet 4 close on the magnet 4 without pairing with the field lines 229 from the magnet 101 of magnetron gun 1.

According to FIG. 2C's configuration 203, the orientation of poles in magnet 4 are flipped compared to their orientation in configuration 202 of FIG. 2B. In configuration 203, the magnetic field lines generated by the magnet 4 are now paired with the magnetic field lines generated by the outer magnetic ring 101b at the gun 1. Some of the field lines from magnet 4 pair with some of the field lines from the outer ring 101b of magnet 101. These field lines 29' are a product of both magnets 101 and 4. In effect, fields from both magnets are creating a merged field, with the result that both magnets 101 and 4 are simultaneously affecting/influencing some of the same spaces (of process chamber 23) and any species in those spaces.

Figure 3:
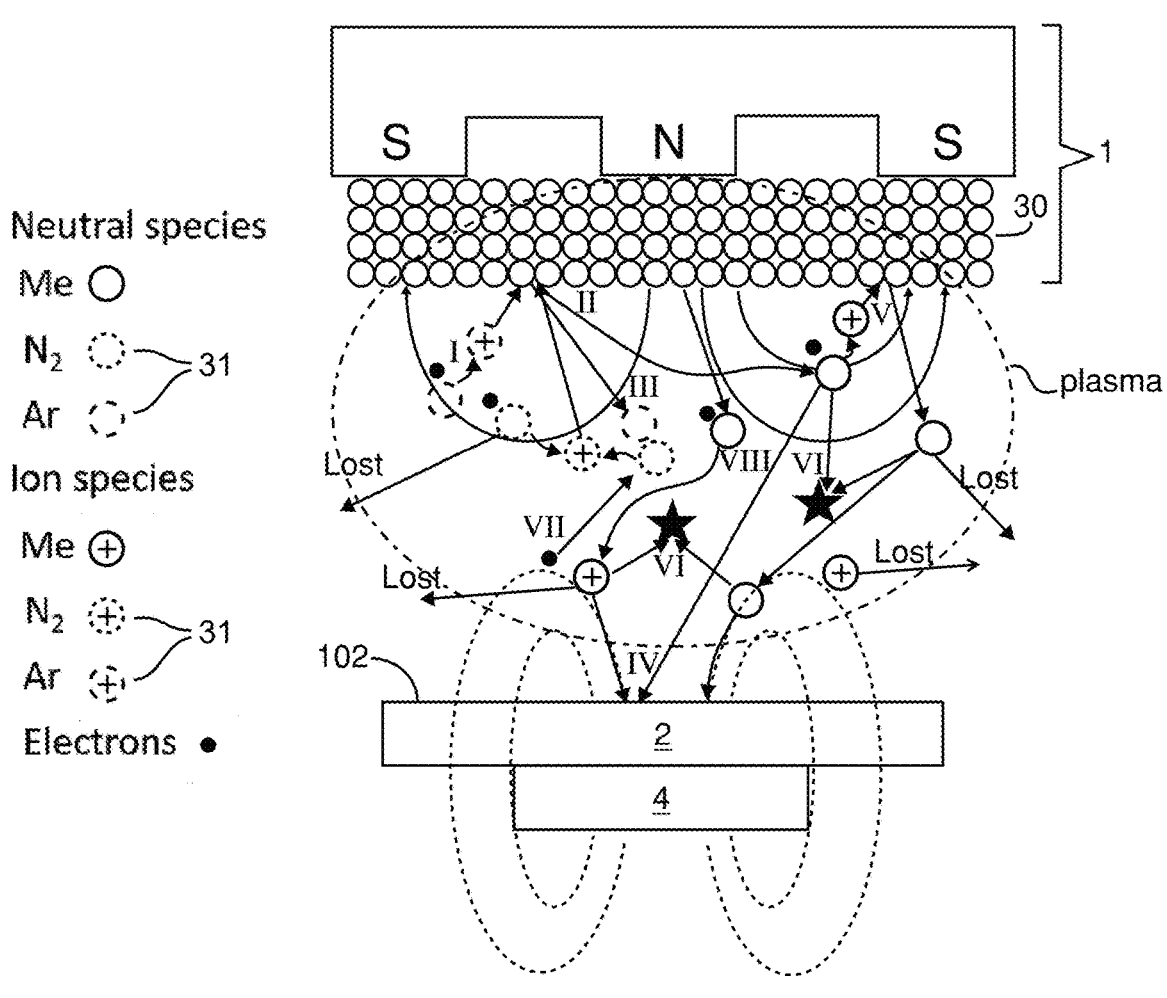
FIG. 3 is a schematic representation of an exemplary setup that illustrates the effect of magnetic biasing.

An exemplary method of physical vapor deposition (PVD) comprises sputtering a substrate with at least one target material from at least one sputtering gun; and controlling one or more of depositional flux, ionization degree of a sputtered species, and microstructure of a deposited coating during the sputtering using a magnetic field at or beside a surface holding or supporting the substrate. The magnetic field is from at least one magnet that is separate from any magnets of the at least one sputtering gun. FIG. 3 and its description below provide exemplary finer details of such sputtering and control.

FIG. 3 is a schematic representation of the processes within an exemplary reactor that gives further illustration of the effect of magnetic biasing by a magnet 4 which is separate and apart from the magnets of any sputtering gun 1. Some relevant events are identified with roman numbers I through VIII. The events I through VI may be consistent if not identical with events of exemplary direct current magnetron sputtering (DCMS) and high-power impulse magnetron sputtering (HiPIMS) processes. However, events IV, VI, VII, and VIII are adapted to the magnetic biasing case.

A magnetron sputtering gun 1 increases the path length of electrons during the plasma discharge, enhancing the probability of collisions with gas molecules 31. These collisions lead to gas ionization (event I). Some of the newly ionized gas species are accelerated to the target 30 surface. The impact of the gas ions on the target surface may produce secondary electrons that feed the electric discharge, may sputter surface atoms Me (event II), may lead to species implantation and target poisoning, or may recombine and bounce, returning to the bulk of the plasma (event III). The sputtered target species Me travel through the plasma bulk and may reach the surface of substrate 2 (event IV). If the electron density is high enough (e.g., electron densities typical in HiPIMS), some of the sputtered material Me may be ionized while crossing the plasma. Depending on the kinetic energy of this ionized material, these ionic species may run away and become part of the film deposition on the substrate 2 (event IV), be lost sideways at the reactor's walls, or be accelerated towards the target 30 leading to self-sputtering (event V) or target poisoning. The collision of gas and sputtered species, neutral and ionic alike, thermalize the plasma bulk and may lead to gas rarefaction (event VI).

The magnetic biasing from magnet 4 adds mirroring and confinement effects to the process. In both the antiparallel (MT) configuration 202 (FIG. 2B) and the parallel (MII) configuration 203 (FIG. 2C), the magnetic field configuration reflects some of the electrons and ion species from near the substrate back towards the plasma bulk (event VII). This effect of reflection may enhance the collisions between species with further thermalization of the plasma (event VIII) and/or enhance the ionization rate. Magnetic biasing may affect the neutral species excitation process due to an increased collision rate. In the MII configuration 203, the magnetic field produces a magnetic confinement bottle that explains the enhanced ionization. In the case of an MT configuration 202, the open shape of the magnetic configuration allows species to leak towards the reactor walls, and the electron density may not become high enough to affect the ionization rate of sputtered material.

Finally, the phenomena resulting from the magnetic bias may affect the deposition flux (event IV). The altered magnetic field of the magnetic biasing will influence the ionic or excited sputtered species differently. Since magnetic biasing has a mirroring effect on the ionic species, the deposition rate of these species may drop for configurations 202 and 203 (FIGS. 2B and 2C). On the contrary, the magnetic field may guide neutral excited species more efficiently increasing their deposition rate, particularly for the MII option due to the magnetic confinement effect of the paired magnetic fields.

Returning to FIG. 1, the sputtering machine 100 comprises or is connected with a number of further subsystems or devices which affect the sputtering process or provide feedback useful to the monitoring and/or regulation of process parameters. Such further subsystems or devices may generally include but are not limited to one or more pumps 25, one or more mass flow controllers 24, power supplies 107, and more elements which will be discussed in the following paragraph which outlines an exemplary sputtering process.

One or more pumps 25 hold chamber 23 at high to medium vacuum (e.g., $5 \times 10^{-6}$ torr or less). The one or more pumps may include, for example, a mechanical vacuum pump and a high vacuum turbo pump. Reactive or inert gases are fed to the system through mass flow controllers 24. For example, at the start of an exemplary process, the chamber 23 may be vented with nitrogen gas supplied through flow controller 24. The nitrogen gas is clean and free of moisture. After venting, the chamber 23 may be accessed (e.g., opened) for a substrate 2 to be loaded on the substrate holder 3. The chamber 23 is then closed/sealed to the external environment (no gases may enter or exit the chamber, except when deliberately desired via either a pump 25 or mass flow controller 24), and the chamber 23 is pumped down. The one or more pumps 25 remove gases from within the chamber 23. A mass controller 24 now admits argon gas, or an alternative to argon, which is used for creating the plasma. The plasma is generated on the magnetron sputtering gun 1 using either a high impulse power generator 26, a DC plasma generator, or an RF generator 27, for example. Starting the plasma is sometimes referred to as striking the plasma. The magnet 4, if it includes an electromagnet, may be powered on to begin the magnetic bias around the substrate 2. When desired temperatures and plasma conditions are reached, the shutter 105 is opened to begin the deposition process. The field produced by the magnet 4 may be changed or modulated at any point during the sputtering process, depending on the desired effects. Other control variables may also be changed during the sputtering process. The amount of power supplied, e.g., to the sputtering gun, is another control variable that may be controlled to affect the sputtering rate and rate of deposition. The plasma composition may be monitored by an optical emission spectrometer 28 and adjusted based on the reading. The plasma is used to sputter atoms from the target 30 and promote reactive processes. A thickness monitor (not shown) may also be included and used to monitor deposition of target species on substrate 2 and assess when to close the shutter 105 to stop deposition. The shutters of additional guns may be opened and closed in succession to perform multiple different coatings in rapid succession. When all desired coatings are complete, power is ramped down and then turned off, and the coated substrate may be recovered from the reactor.

Figure 4:
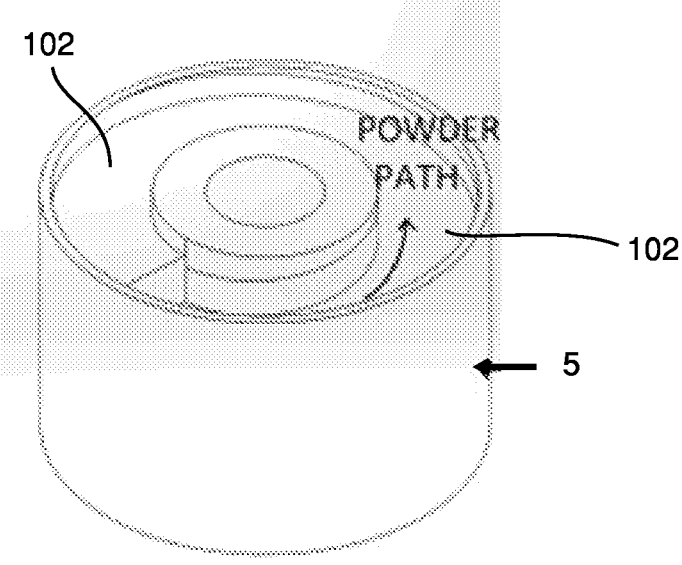
FIG. 4 is an example substrate cup for use with powder substrates.

FIG. 4 shows an exemplary holder cup 5 which may be part of a substrate holder 3, especially when it is desired that the substrate holder 3 accommodates powder/particulate substrates. Powder/particulate substrate may be loaded into the cup 5. Cup 5 may then be vibrated to cause the substrate to travel along a surface of the cup 5, the net movement following a helical path as indicated in FIG. 4. A crucible carrier and a pouring device may be used to transfer powder from outside a sputtering machine to a holder cup 5 (see FIGS. 5 and 6, discussed below). The holder cup may be positioned atop a shaking table, and the table vibrations lift and transfer momentum to the particles, which advance along a path that exposes them to the sputtered species.

Referencing FIG. 1 again, table 14 is vibratable by a piezoelectric actuator, a motor 15 controlled by the power supplies 16 and/or 17, or a combination of both. The vibration on the table 14 is insulated from the body of chamber 23 by springs 18. The isolator 12 is positioned and/or mounted atop the table 14, and the isolator 12 supports the holder cup 5. Accordingly the vibration of table 14 imposes movement on the powder particles loaded on the holder cup 5. Such an exemplary setup is especially well suited for generating core-shell type structures in which the starting powder becomes core material and the deposition material becomes a shell. Multiple distinct shells may be applied in a single sputtering process, e.g., by varying the magnetic bias during sputtering, and/or by closing and opening different shutters to sputter different targets (in a reactor which contains a plurality of sputter guns 1).

The temperature of the surface 102 of the substrate holder 3 may be measured by a temperature sensor such as but not limited to a thermocouple 6. Based on the thermocouple reading, a thermoelectric device 19 heats or cools the substrate holder cup 5 (or more generally, the substrate holder 3) using the power supply 20 to maintain a desired temperature range or level for the surface 102. This is another control variable for the sputtering process. Alternative temperature control devices besides a thermoelectric device may be used in some embodiments. The level of substrate holder 3 (and it surface 102 which holds the substrate 2) as well as the gun-to-substrate distance are adjustable using screws 21. Meanwhile, the whole substrate holder assembly 3 is locked to the chamber floor by the bolts 22.

As discussed briefly above, the sputtering machine 100 may be configured for compatibility with one or a variety of different substrate types, including but not limited to flat/ planar substrates, curved or uneven substrates, bulk substrates, and powder or particle/particulate substrates. A single sputtering machine 100 and a substrate holder 3 may be compatible with one, some, or all of these different substrate types and others without any modification to the machine 100 or substrate holder 3 when switching among substrate types. For purposes of this disclosure, "substrate" generally includes any material or surfaces of such a material which are intended by the operator to be coated by a sputtering process. A previously applied coating may itself be a substrate for a further coating. In the case of powders, the machine 100 may be configured to coat powders that mainly lay in or on a substrate holder, in particular a holder cup. "Cup" generally refers to a three-dimensional structure capable of retaining a positive volume of substrate. Retention in this context generally involves preventing a loss of material not only along a direction of Earth's gravity but also laterally (a positive magnitude vector component in a direction perpendicular to gravity).

Figure 5:
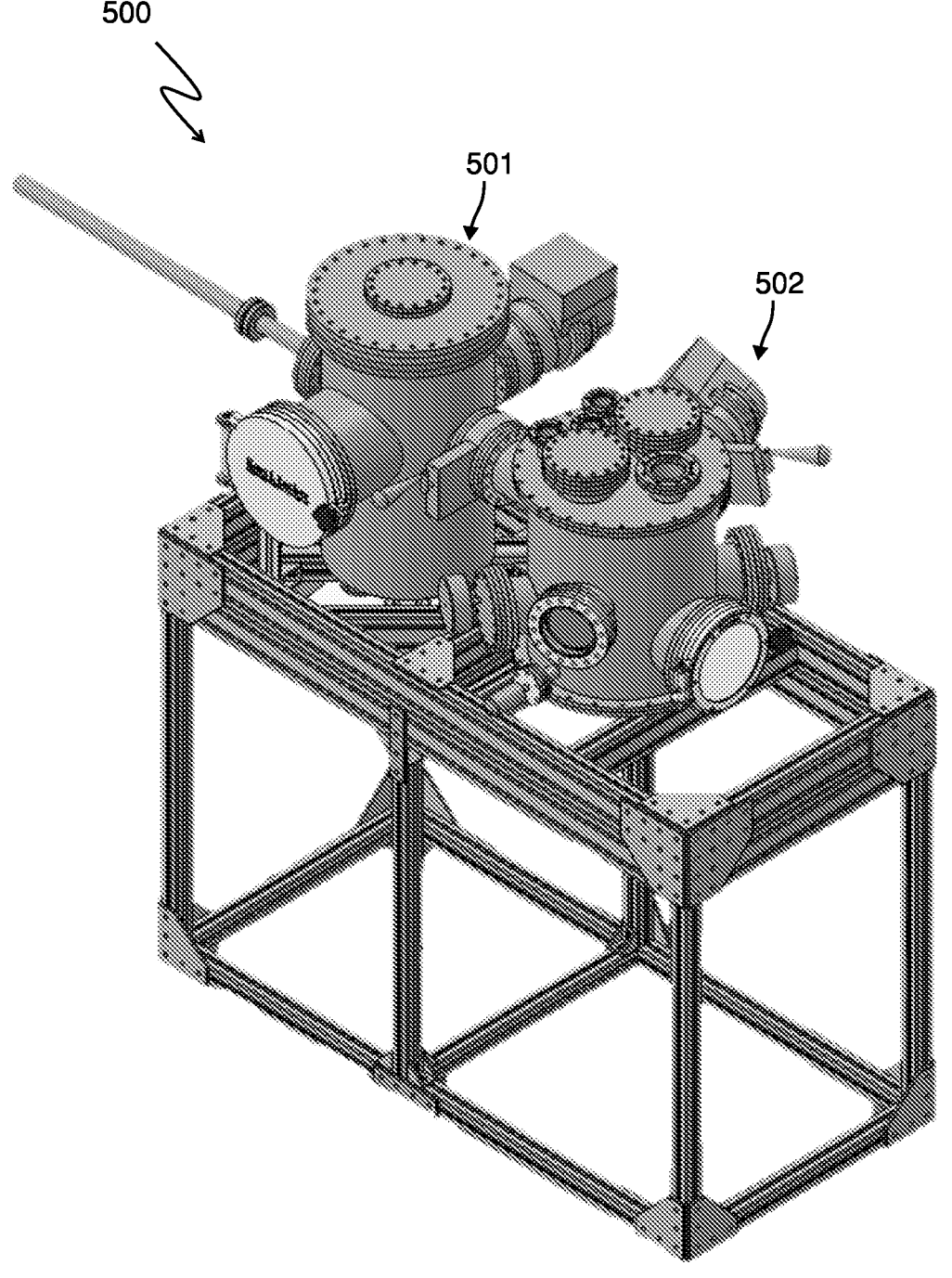
FIG. 5 is an exemplary platform system comprising two reactor chambers.
Figure 6:
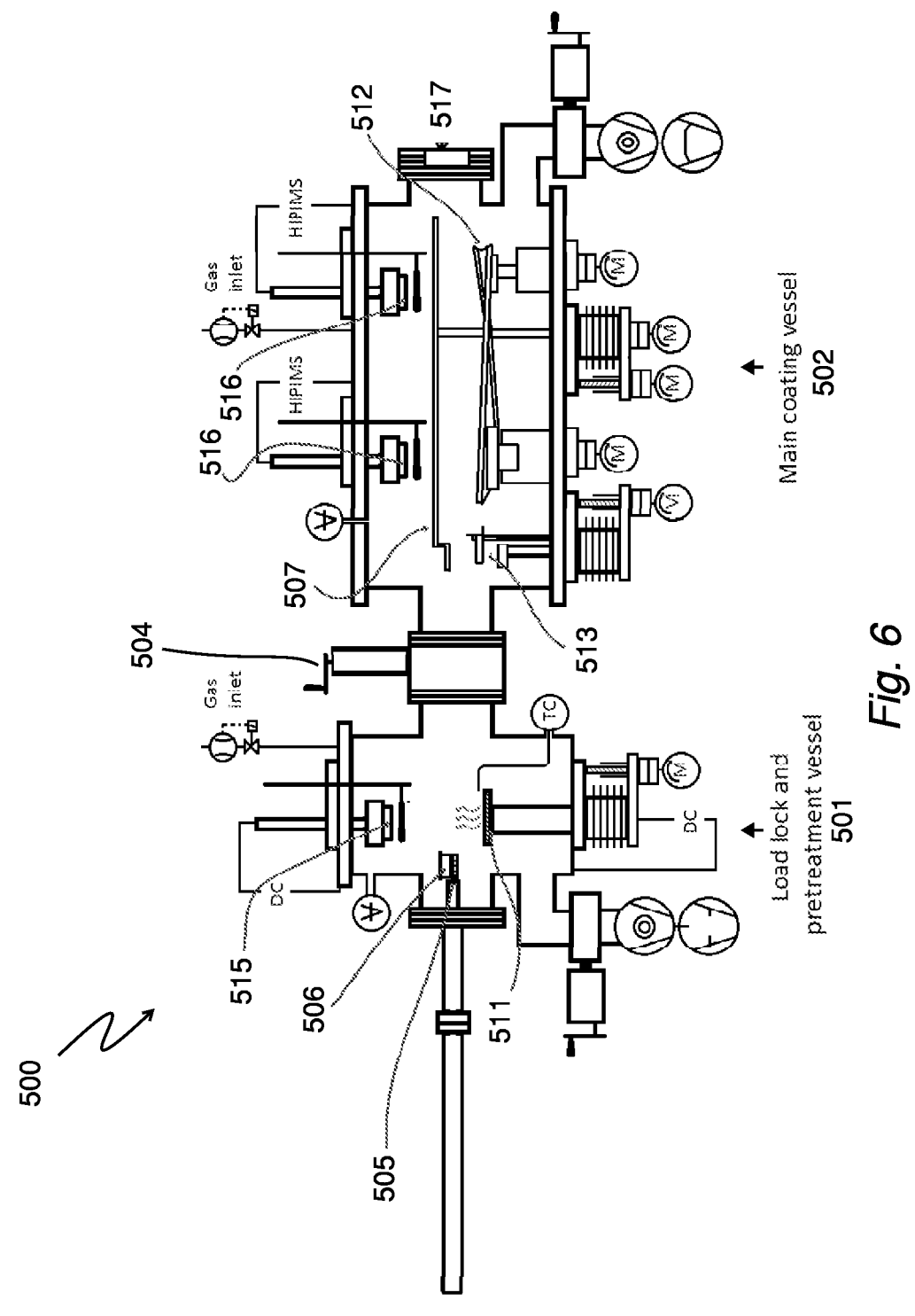
FIG. 6 is a schematic corresponding with the system of FIG. 5.

FIGS. 5 and 6 depict an exemplary platform system 500 from an exterior perspective view and as a schematic, respectively, comprising at least two reactor chambers (e.g., vessels). A substrate holder 3 as discussed above may be incorporated as part of such a system 500. The system 500 serves as an example of features and configurations which may be used in some exemplary embodiments, sometimes in combination with a substrate holder 3 according to the explanations above, and sometimes with substrate holders none of which correspond to substrate holder 3 of FIG. 1.

The platform system 500 comprises a first reactor chamber 501 and a second reactor chamber 502, allowing for design processes with several steps. Each chamber 501 and 502 has a precise atmosphere control with its own vacuum system and gas inlet. The two chambers are connected through a gate valve 504 to transfer samples with a transfer arm 505 from one reactor to the other reactor as show in FIG. 6. The sample may be a bulk substrate or powder. In the case of a bulk substrate, the substrate is attached to a sample carrier 506. This carrier may be manipulated by the transfer arm 505 and assembles with the bulk substrate holder 507 in the main coating vessel 502. In the case of a powder sample, the sample carrier 506 may be a crucible style. The powder is transferable to a powder substrate table 512 with the aid of a powder pouring device 513 in the second reactor 502.

In the first chamber 501, it is possible to carry out pretreatments such as surface etching, annealing, or base coating. Glow-discharge-plasma-etching using a DC power supply between the substrate holder 511 and the vessel wall leads to surface activation and cleaning. This pretreatment and load lock chamber is equipped with a DC-sputtering source 515 to deposit a base coating; and/or annealing is possible through a radiation source located on the substrate holder 511.

The main coating vessel 502 is equipped with two high power impulse magnetron sputtering (HiPIMS) guns 516. The helicoidal path that each powder particle follows (FIG. 4) is expose to the two HiPIMS guns. The movement of the powder particles helps to improve the homogeneity of the coating. The vessel 502 may be accessed via a door 517.

Figure 7:
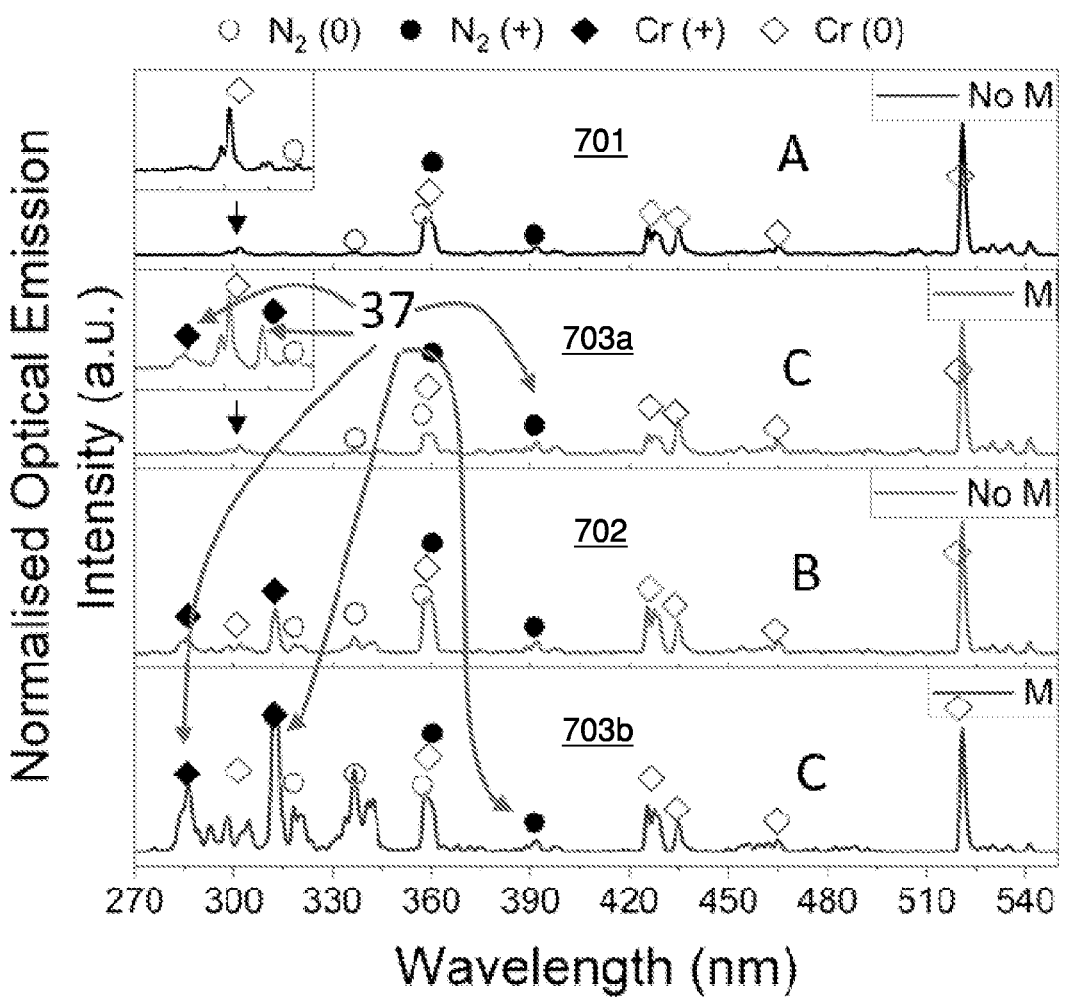
FIG. 7 is example optical emission spectra that illustrate the effects of magnetic bias.

FIG. 7 shows optical emission spectroscopy (OES) spectra that illustrate, by way of example, the advantageous effects of an exemplary ionization process that employs magnetic biasing. The plots are labeled 701, 702, 703*a*, and 703*b*. Each plot shows normalized optical emission intensity as a function of wavelength. Plot 701 corresponds with a DCMS process used to sputter chromium without magnetic biasing. Plot 701 shows no chromium ionization is present. Plot 702 corresponds with a HiPIMS process used to sputter chromium without magnetic biasing. Moderate ionization of the sputtered species occurs because of the high electron density through which the sputtered species travels while crossing the plasma.

The optical emission spectra in FIG. 7 point out the head band identification of ionized nitrogen and chromium 37. In contrast to plots 701 and 703, the plots 703*a* and 703*b* show the effects of adding a magnetic biasing effect to the DCMS process and the HiPMS process, respectively. A comparison of plot 701 with plot 703*a*, and a comparison of plot 702 with plot 703*b*, shows a boost of ionization of chromium sputtered material 37 and nitrogen molecules after a magnetic bias is added in the vicinity of the substrate. The relative rise in ionized chromium peaks in both processes is indication of the ionization enhancement caused by the magnetic biasing. The precise effects of magnetic biasing for any given reaction or embodiment depends on the particular settings used for parameters of magnet 4. As already discussed, FIGS. 2A, 2B, and 2C show three alternative magnet bias configurations which may be achieved simply by changing the inputs (e.g., control currents) delivered to magnet 4. Other magnet bias configurations besides the three depicted by FIGS. 2A, 2B, and 2C are also producible.

Figure 8:
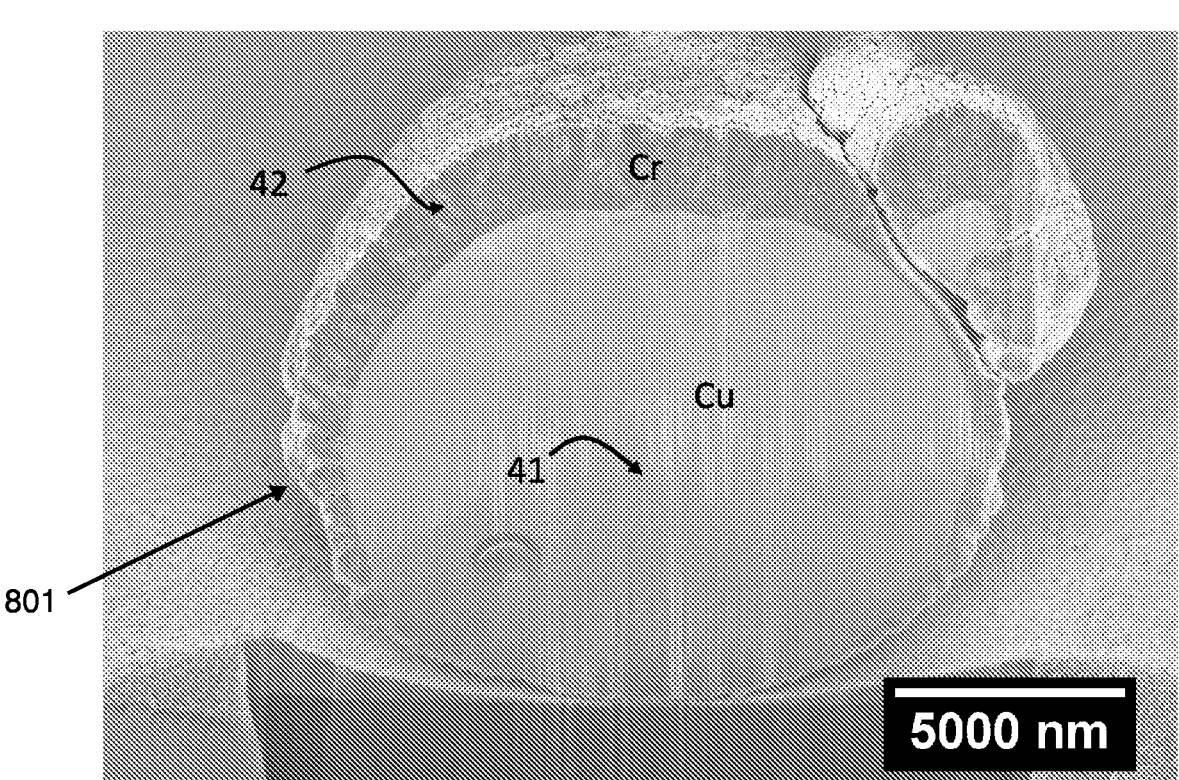
FIG. 8 shows an image of a core-shell type structure produced by sputtering a powder substrate.

The provision in exemplary embodiments of a magnet or magnet array separate from the magnets of sputtering guns, where such further magnet is able to provide a magnetic bias at or around the substrate surface, results in new levels of control over the chemistry and microstructure of coatings made by physical vapor deposition. By changing aspects of the magnetic bias (for nonlimiting illustration see FIGS. 2A-2C and discussion above), coating properties may be changed even when no changes are made to the sputtering gun, target, and/or substrate. To illustrate, FIG. 8 shows an image 800 of a core-shell type structure 801 with a powder as core material 41 and the deposited coating material as shell 42. The structure 801 has been cross-sectioned prior to imaging to clearly make visible both core and shell. The structure 801 is an example product of an exemplary sputtering process that employs a magnetic bias. For the specific image 800, the core 41 was copper and the coating 42 was chromium. A certain level of detail of the microstructure of coating 42 is visible in FIG. 8. The particle microstructure of coatings for further core particles 41 may be deliberately differed from the coating 42 in the image 800 by changing parameters of the magnetic bias. Some or all of the process parameters other than those which change the magnetic bias may even go unchanged, e.g., the sputtering gun may be operated with the same operating conditions; the substrate may remain as copper particles; and the target may remain as chromium. Changes to the magnetic bias alone may be sufficient to achieve desired differences in resultant coatings.

Figure 9:
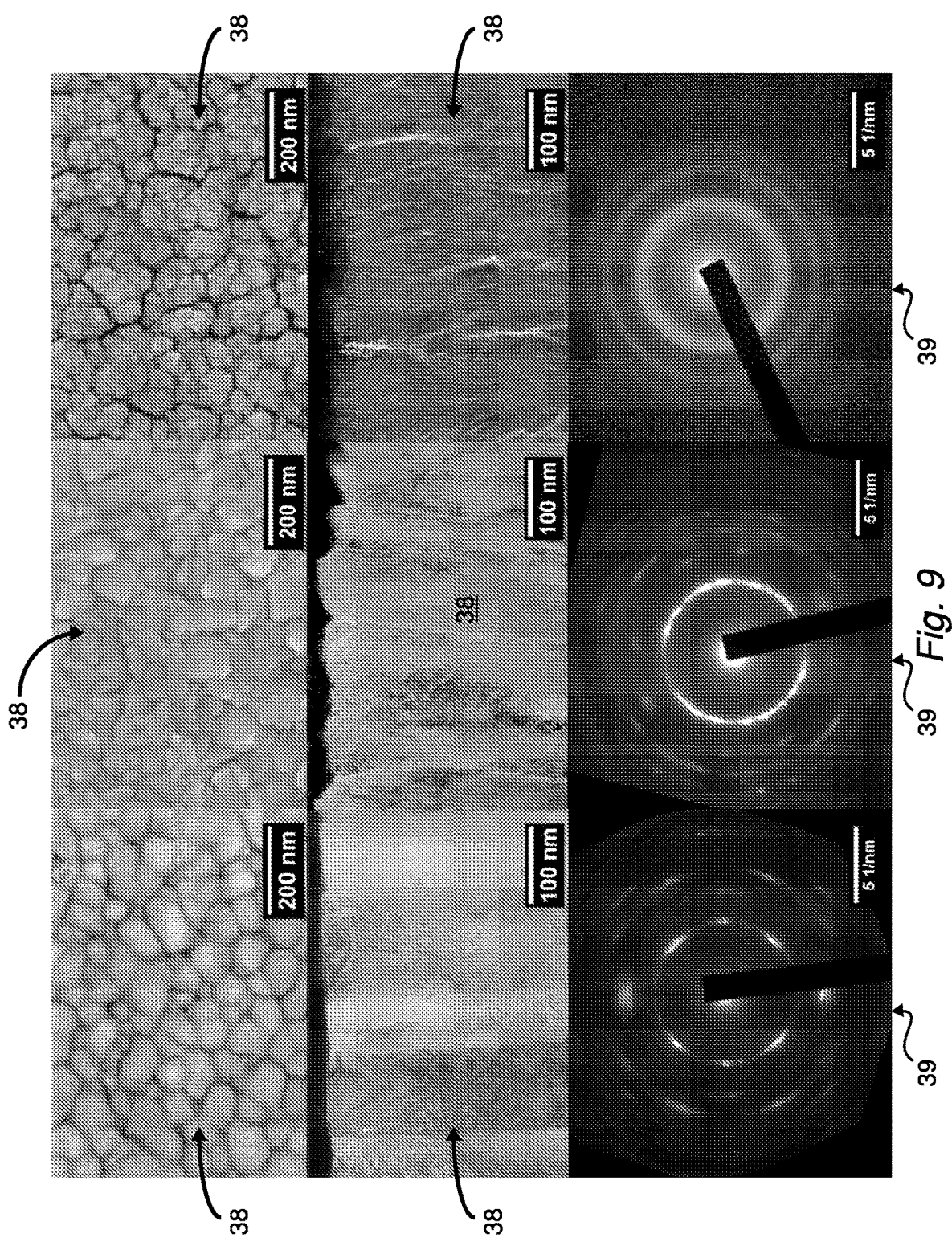
FIG. 9 is a compilation of images showing exemplary coatings with different microstructures that may be produced by different magnetic bias settings.

FIG. 9 is a compilation of nine images which illustrate nonlimiting examples of different coatings and crystal structures that may result simply from deliberate changes in the magnetic bias during the sputtering process. As the images show, some physical properties will differ depending on the differing structures. The energy of the incoming species is affected by the sputtering parameters and particularly by the effect of the magnetic biasing. As shown in FIG. 9, the structure density 38 can sweep from very highly packed columnar growth to fibrous columnar. Moreover, the crystal texture 39 changes from highly texturized at the bottom left to nanocrystalline randomly oriented in the bottom right of FIG. 9. This difference is due to the modification of the species excitation and modified deposition flux due to the magnetic field biasing feature of this disclosure. The boosted ionization effect from the magnetic biasing is usable to control the densification and structure of the films, boost reactive sputtering, and influence the crystal texture.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be separated from or combined with the features of any of the other several embodiments without departing from the scope or spirit of the present invention. Any recited method can be carried out in the order of events recited or in any other order which is logically possible.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

While exemplary embodiments of the present invention have been disclosed herein, one skilled in the art will recognize that various changes and modifications may be made without departing from the scope of the invention as defined by the following claims.

What is claimed is:

1. A substrate holder for a sputtering machine or process, comprising
a surface arranged to hold or support a powder substrate while the powder substrate is coated by target material from at least one sputtering gun;
at least one magnet for generating one or more magnetic fields at or beside the surface, wherein the at least one magnet is separate from any magnets of the at least one sputtering gun, and wherein the at least one magnet is positioned behind the surface; and
a piezoelectric actuator configured to vibrate the surface with vibrations configured to lift and transfer momentum to particles of the powder substrate so that the particles advance along a path that exposes them to the sputtered species.

2. The substrate holder of claim 1, further comprising a controller for changing one or more properties of the one or magnetic fields of the at least one magnet.

3. The substrate holder of claim 2, wherein the controller comprises control electronics and the at least one magnet is at least one electromagnet.

4. The substrate holder of claim 1, wherein the at least one magnet comprises a permanent magnet.

5. The substrate holder of claim 1, wherein the surface belongs to a holder cup, wherein the holder cup is configured to store the powder substrate, wherein the surface forms a helical path.

6. The substrate holder of claim 1, further comprising an isolator to which the surface is mounted and which electrically isolates the surface.

7. The substrate holder of claim 6, further comprising a deflector that shields the isolator from at least some metallization, wherein the deflector is a conductive and nonmagnetic solid, and wherein the deflector at least partly encases the isolator while leaving a gap that separates an inner surface of the deflector and an outer surface of the isolator.

8. The substrate holder of claim 1, further comprising a thermocouple that measures a temperature of the surface.

9. The substrate holder of claim 8, further comprising a thermoelectric device configured to heat or cool the surface based on the temperature measured by the thermocouple.

10. A sputtering machine, comprising
one or more sputtering guns comprising at least one first magnet;
at least one substrate holder, comprising
a surface arranged to hold or support a powder substrate while the powder substrate is coated by target material from at least one gun of the one or more sputtering guns;
at least one second magnet for generating one or more magnetic fields at or beside the surface, wherein the at least one second magnet is separate from magnets of the one or more sputtering guns including the at least one first magnet; and
a piezoelectric actuator configured to vibrate the surface with vibrations configured to lift and transfer momentum to particles of the powder substrate so that the particles advance along a path that exposes them to the sputtered species,
wherein the at least one second magnet is one or more of positioned behind the surface,
arranged in a parallel configuration with the at least one first magnet of the one or more sputtering guns, and
arranged in an antiparallel configuration with the at least one first magnet of the one or more sputtering guns.

11. The sputtering machine of claim 10, further comprising a controller for changing one or more properties of the one or magnetic fields of the at least one second magnet.

12. The sputtering machine of claim 11, wherein the controller comprises control electronics and the at least one second magnet is at least one electromagnet.

13. The sputtering machine of claim 10, wherein the at least one second magnet comprises a permanent magnet.

14. The sputtering machine of claim 10, wherein the surface belongs to a holder cup, wherein the holder cup is configured to store the powder substrate, wherein the surface forms a helical path.

15. The sputtering machine of claim 10, further comprising an isolator to which the surface is mounted and which electrically isolates the surface.

16. The sputtering machine of claim 15, further comprising a deflector that shields the isolator from at least some metallization, wherein the deflector is a conductive and nonmagnetic solid, and wherein the deflector at least partly encases the isolator while leaving a gap that separates an inner surface of the deflector and an outer surface of the isolator.

17. The sputtering machine of claim 10, further comprising a thermocouple that measures a temperature of the surface.

18. The sputtering machine of claim 17, further comprising a thermoelectric device configured to heat or cool the surface based on the temperature measured by the thermocouple.

19. A method of physical vapor deposition (PVD), comprising sputtering a powder substrate with at least one target material from at least one sputtering gun comprising at least one first magnet; and controlling at least deposition flux during the sputtering using a magnetic field at or beside a surface holding or supporting the powder substrate, wherein the magnetic field is from at least one second magnet that is separate from any magnets of the at least one sputtering gun including the at least one first magnet; and lifting and transferring momentum to particles of the powder substrate by vibrating the surface with a piezoelectric actuator so that the particles advance along a path that exposes them to the sputtered species, wherein the at least one second magnet is one or more of positioned behind the surface, arranged in a parallel configuration with the at least one first magnet of the at least one sputtering gun, and arranged in an antiparallel configuration with the at least one first magnet of the at least one sputtering gun.

* * * * *